United States Patent [19]

Ramalingam et al.

[11] Patent Number: 4,839,011
[45] Date of Patent: Jun. 13, 1989

[54] ARC COATING OF REFRACTORY METAL COMPOUNDS

[75] Inventors: Subbiah Ramalingam, Roseville; Rongfeng Chang, Minneapolis, both of Minn.

[73] Assignee: Regents of the University of Minnesota, Minneapolis, Minn.

[21] Appl. No.: 206,988

[22] Filed: Jun. 10, 1988

Related U.S. Application Data

[63] Continuation of Ser. No. 848,720, Apr. 4, 1986, abandoned, which is a continuation-in-part of Ser. No. 825,958, Feb. 4, 1986, Pat. No. 4,673,477, which is a continuation of Ser. No. 585,845, Mar. 2, 1984, abandoned.

[51] Int. Cl.$^4$ ............................................. C23C 14/22
[52] U.S. Cl. .............................. 204/192.38; 204/298; 427/37; 427/47
[58] Field of Search ............. 204/192.38, 298, 192 R; 427/37, 47; 118/50.1, 723

[56] References Cited

U.S. PATENT DOCUMENTS

| | | | |
|---|---|---|---|
| 3,625,848 | 12/1971 | Snaper | 204/192 |
| 3,956,093 | 5/1976 | McLeod | 204/192 |
| 4,444,635 | 4/1984 | Kobayashi et al. | 204/192 R |
| 4,444,643 | 4/1984 | Garrett | 204/298 |
| 4,511,593 | 4/1985 | Brandolf | 427/37 |
| 4,563,262 | 1/1986 | Sableu et al. | 204/298 |

FOREIGN PATENT DOCUMENTS 363375  1/1979  U.S.S.R. ................ 427/37

OTHER PUBLICATIONS

Russian Inventors Certificate 711787, published Oct. 7, 1980, entitled, "An Electric-Arc Vaporizer of Metals".
D. Hadfield, Permanent Magnets and Magnetism, Iliffe Books Ltd., London, 1962, pp. 213-214.

*Primary Examiner*—John F. Niebling
*Assistant Examiner*—William T. Leader
*Attorney, Agent, or Firm*—Kinney & Lange

[57] ABSTRACT

A process for arc coating alloy films on objects using a cathode or target having the two materials from which the alloy is to be formed. An alloy nitride coating may be formed by reacting the flux of coating materials from the cathode with nitrogen. The arc is magnetically steered to move in a closed arc track. The track is positioned partially in each material of the cathode to provide a flux having the desired proportion of each material. The length of the closed arc track is defined in relation to the arc speed of travel so that the cathode materials remain molten in the arc track during operation.

10 Claims, 6 Drawing Sheets

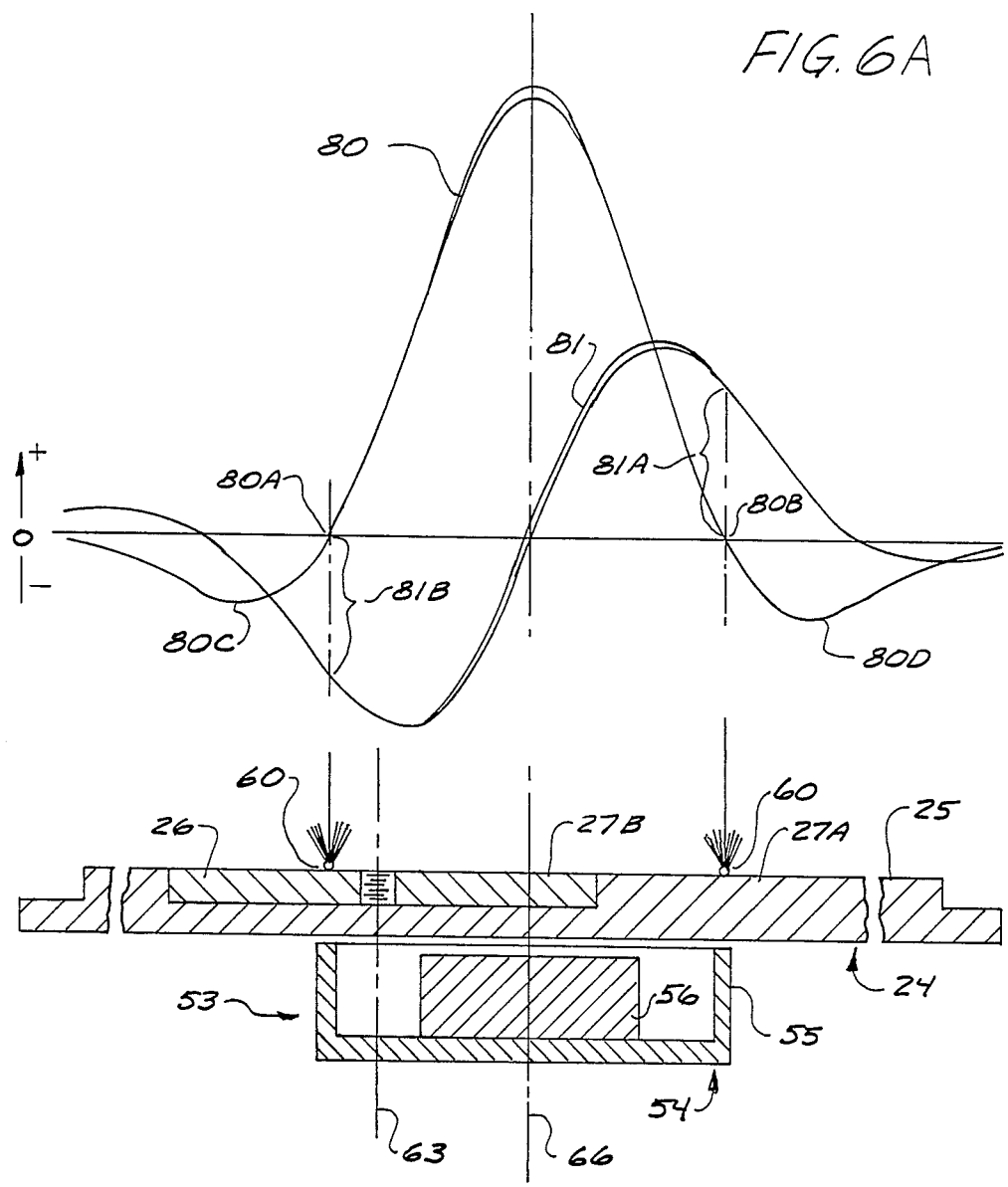

ARC COATING OF REFRACTORY METAL COMPOUNDS

CROSS REFERENCE TO RELATED APPLICATIONS

This application is a continuation of copending application Ser. No. 06/848,720, filed Apr. 4, 1986 now abandoned, which in turn was a continuation-in-part of U.S. patent application Ser. No. 825,958, filed Feb. 4, 1986, entitled Control vacuum Arc Material Deposition Method and Apparatus, now U.S. Pat. No. 4,673,477, which in turn was a continuation of U.S. patent application Ser. No. 585,845, filed Mar. 2, 1984, abandoned.

BACKGROUND OF THE INVENTION

1. Field of the Invention.

The present invention relates to arc coating of metal targets with alloy hard surface coatings.

2. Description of the Prior Art.

Arc coating films onto objects in which a metal target serves as a source for the coating flux applied in a vacuum ambient atmosphere is known. By reacting the flux derived from a metal cathode with a reactive gas such as nitrogen, titanium nitride coatings are now routinely produced using arc coating techniques. These physical vapor deposition techniques produce coatings that offer performance advantages over other surface treatments.

Three physical vapor deposition variations are currently envisioned for wear coating applications, including electron beam evaporation, sputtering, and presently for nonalloy techniques, the cathodic arc. The cathodic arc depositions, the newest of the three, is a high throughput production process that employs multiple arc evaporators to vaporize the coating material. This is presently done with commercial equipment such as that sold by a number of manufacturers, but problems occur in trying to produce coating alloyed from a composite cathode, because of the lack of the ability to steer the arc properly. The process does not permit forming alloy coatings with composite targets.

U.S. Pat. No. 3,625,848 to Snaper and U.S. Pat. No. 3,793,179 to Sablev et al. each disclose apparatus usable for metal coating of parts, but they do not teach precisely controlled arc steering, nor alloyed compound deposition.

To produce films of alloyed materials by vacuum deposition, more than one source of coating flux may be used. This can be done, in principle, with electron beam coating sources, sputtering sources and hollow cathode discharge coating sources. However, precise control of the composition of the film deposited requires precise and proportional control of each coating source. To overcome this problem, alloyed source materials may be used. But differential sputtering and differential fractionation of the alloy during the film deposition process usually leads to the formation of a film with a composition which differs from that of the source material. This problem is partly overcome or compensated by using a source material differing in composition from that of the film desired. The needed composition adjustment is found by trial and error. Even this technique requires exact film deposition condition reproducibility to assure film composition reproducibility.

When arc coating techniques are used to deposit alloy films, composition reproducibility is a much more difficult problem than with vacuum deposition. Arc sources, as taught by the Sablev et al. and Snaper patents mentioned above, produce metal vapor for film deposition and metal droplets which are commonly known as macro-particles. Proportion of the coating material released in the vapor form and in the droplet form for film deposition varies from material to material and with operating conditions. Reproducible arc coating of alloyed material is therefore very difficult.

By acquiring control over the motion of the arc on the cathode, that is the target from which the coating flux is derived, the steered arc coating process allows the precise control over the composition of the film deposited. Control over composition is obtained by controlling the time the arc spends in the different regions of a composite target and by eliminating the formation of macro-particles. The time the arc spends on each part of a composite target is varied by changing the arc velocity on the cathode surface. Therefore, a reproducible composition of the alloyed film is obtained with steered arc coating when a composite target made of more than one material is used and the composition can be changed by changing the arc velocity.

SUMMARY OF THE INVENTION

The present invention relates to a method and apparatus for permitting the depositing of metal alloys and alloyed compound films in a controlled process, that is low cost and very effective for obtaining reduced macro-particle and macro-particle free films or coatings on surfaces of objects.

The present method comprises using an arc deposition apparatus utilizing a cathode or target composed of at least two separate metals, each of which form part of the active surface of the cathode. The metals forming the cathode are selected to provide for the alloy desired for the coating. The metals to be used for alloying are positioned in selected separate locations of the cathode, so that upon forming an arc, and then steering the arc precisely, the amount of the metal flux formed from each of the different metals (more than two can be used) is controlled and the alloy characteristics of the flux being formed for the deposited coating is therefore precisely controlled as well.

The technique of steering the arc so that it will travel repeatedly over a desired controlled track is disclosed in U.S. patent application Ser. No. 825,958, filed Feb. 4, 1986 now U.S. Pat. No. 4,673,477. The arc steering or control apparatus disclosed herein is the same as that disclosed in such earlier application. The precise steering enables one to have control of the arc motion over the active surface of the cathode. The steering control eliminates periodic arc quenching due to chaotic arc motion beyond the cathode edge (as was a problem in the prior art), and provides for precise control in the alloying process so that the appropriate characteristics of the deposited alloy film can also be controlled.

A magnetic field is established, which controls the arc to move in a closed path, and the magnet establishing the magnetic field and thus the arc then may be periodically swept across the cathode surface. The arc is made to travel repeatedly over the same track to provide for vapor production from a composite cathode or target made up of at least two metals that are both vaporized and the vapor is combined with a gas to provide a desired alloyed hard compound coating on a part. The applied magnetic field for arc control is locally parallel to the active surface of the cathode, which generates a Hall force that acts on the ions as well as the electrons in the vicinity of the cathode The Hall force leads to cycloidal motion of electrons and massive ions move in the opposite direction. As they move under the influence of the applied magnetic field, the ions are also subject to the prevailing electric field. They are attracted to the active surface of the cathode. Sufficient number of ions impinging on the active surface of the cathode in the vicinity of the original cathode spot at a location consistent with the prevailing electric and magnetic fields induce intense local heating and electron emission in order to render this spot the new cathode spot. The presence of a local magnetic field appropriately disposed at this location can in turn lead to the generation of the next new cathode spot. The chaotic sequence of arc spots on the cathode surface of the prior arc deposition devices is replaced with an orderly sequence where all permitted cathode spots lie on a preselected closed path track.

The length of the preselected track or path of the arc as controlled by the magnetic field is selected so that the cathode material remains molten in the track. That is, the sequence of arc spots in its closed, controlled path returns to the starting point before the cathode material cools sufficiently to solidify. Metal vapor emitted from the molten track produces a differential pressure distribution over the cathode surface with higher vapor pressures immediately above the molten track than elsewhere over the cathode surface. The magnetic field and the differential vapor pressure generated over the cathode acting separately and in conjunction with each other enables control of the arc motion on the active surface of the cathode.

By steering and controlling the arc as disclosed, when the arc current is maintained at approximately 50 amperes, the arc voltage is in the range of 27 to 32 volts with a titanium target and 25 to 28.3 volts with zirconium. By steering the arc, the arc voltage and hence the mean energy of the coating flux is kept relatively higher. When nitrogen is admitted, the arc voltage is further raised due to the reaction of the nitrogen with the molten metal in the arc track. Formation of the metal nitride in the arc track over molten material causes the increase in arc voltage and this metal nitride layer formed in the arc track of the steered arc coating process of the present invention acts to suppress the formation of macro-particles in order to produce good quality films.

The magnetic field of a solenoidal coil or Helmholtz coil system may be superpositioned on the magnetic field of the main magnet to modify the magnetic field produced on the active surface of the cathode. The direction of the current through the coil is chosen to either reinforce or reduce the magnetic field strength vertical to the active surface of the cathode. The solenoidal coil or Helmholtz coil system provides additional control over lateral motion of the arc along the path defined by the movable magnet on the active surface of the cathode. The magnetic field established controls the movement of the arc in a continuous track. The arc is controlled in a path on the cathode surface by the individual and the combined action of the magnetic field and continuous arc discharge when molten tracks are produced (due to high vapor pressure immediately above the arc track). The latter is a result of arc steering and depends on appropriately shaped magnetic fields.

Arc coating with composite metal targets for alloy coating, such as that disclosed herein, offers a low cost way for the production of improved coatings for friction and wear applications. The control and steering of the arc is essential to insure that the required coating composite is balanced and to insure that the coating can be reproduced reliably on multiple parts.

The present invention is useful for depositing alloy protective coatings and tool coatings. Continuous coating on the surface of plates or films can also be provided.

BRIEF DESCRIPTION OF THE DRAWINGS

FIG. 6B is a sectional view substantially along the same line as FIG. 3 but inverted and with parts removed for clarity and correlated to a graph of FIG. 6A which is positioned above the inverted cathode illustrating the vertical and horizontal components of the magnetic field on the cathode surface, its relation to the trajectory or track of the steered arc, and illustrating the peripheral pole of the arc steering permanent magnet means.

DETAILED DESCRIPTION OF THE PREFERRED EMBODIMENTS

Figure 1:
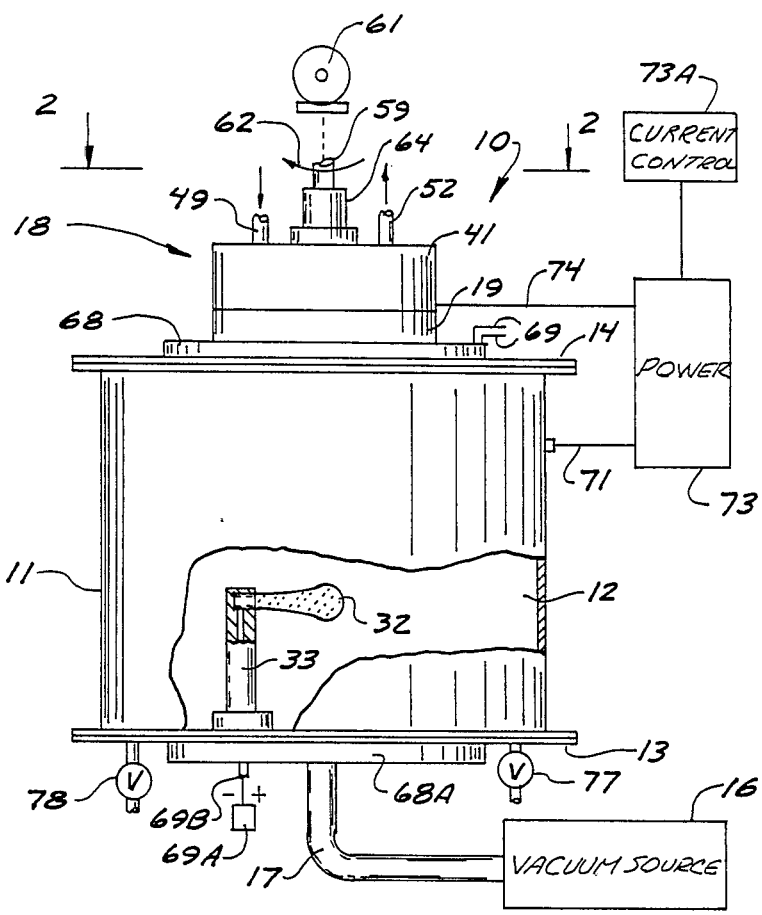
FIG. 1 is an elevational view, partly sectioned, of the controlled vacuum arc material deposition apparatus of the invention.
Figure 2:
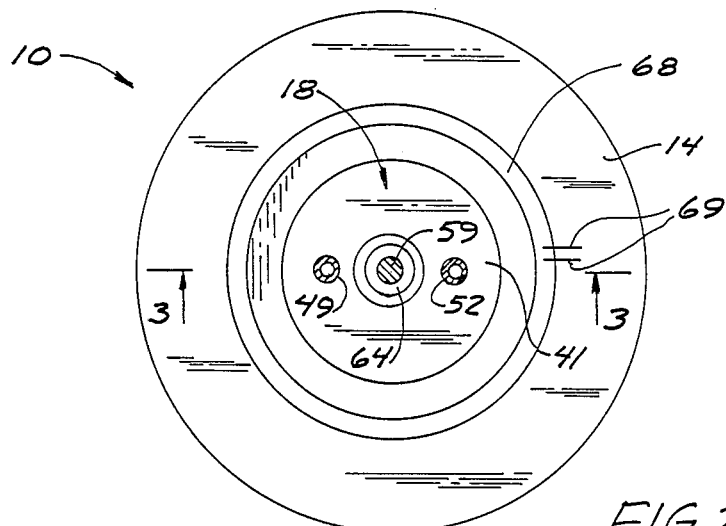
FIG. 2 is a sectional view taken along the line 2—2 of FIG. 1.

Referring to FIG. 1, there is shown the controlled vacuum arc material deposition apparatus 10 used with the invention. The apparatus 10 has a housing 11 enclosing a vacuum chamber 12. Housing 11 includes a generally flat bottom wall 13 and a flat top wall 14. A vacuum source 16 coupled to bottom wall 13 with a tubular member or hose 17 is operable to maintain a vacuum in chamber 12. Chamber 12 is evacuated to pressures from below $10^{-6}$ to $10^1$ mm of Hg.

Figure 3:
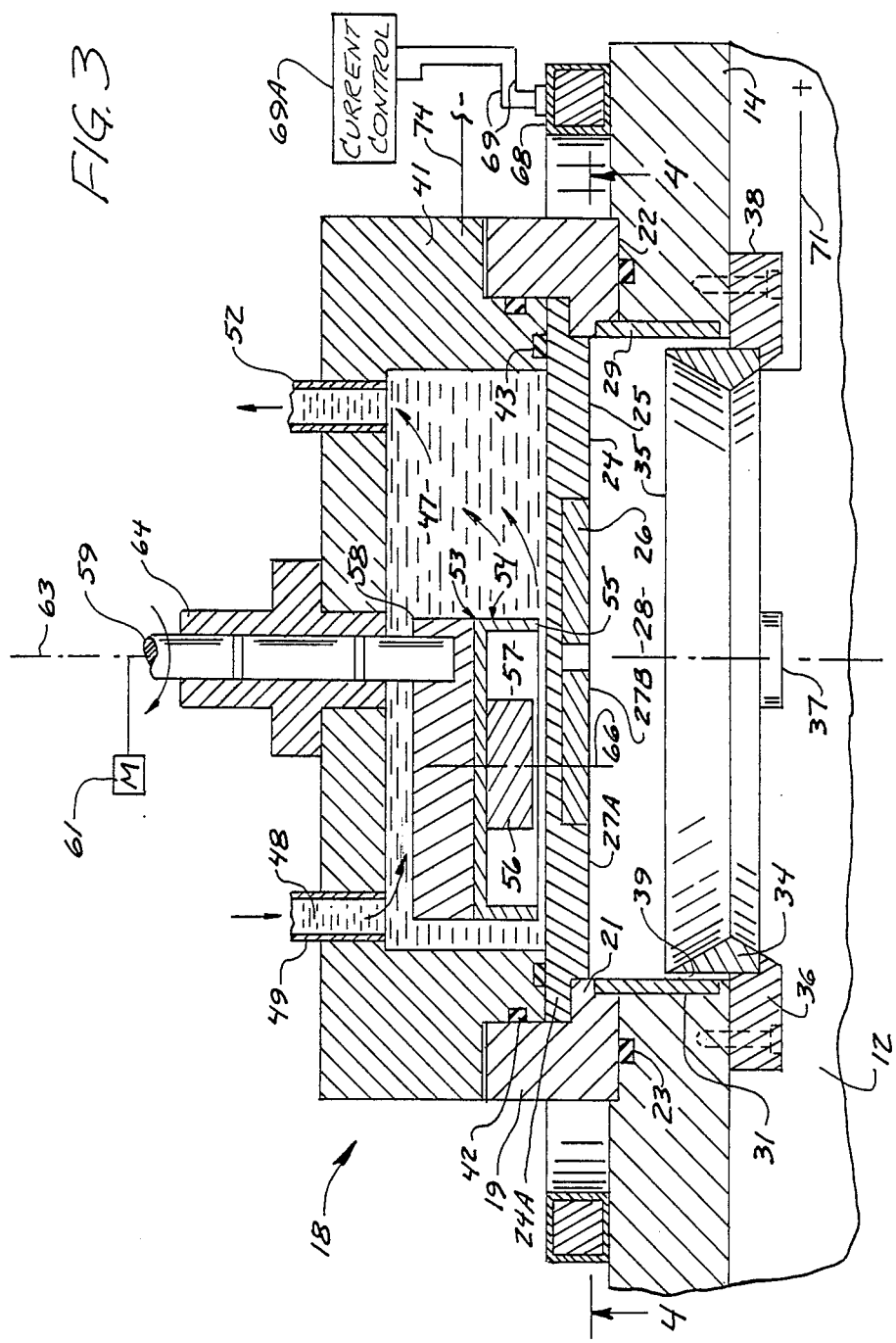
FIG. 3 is an enlarged sectional view taken along the line 3—3 of FIG. 2 showing a material deposition arc controlled arc head.

A material deposition head indicated generally at 18 is, as shown, mounted on top wall 14. The head 18 can be located entirely within the vacuum chamber 12. Referring to FIG. 3, head 18 has an annular body 19 provided with an inwardly directed annular shoulder 21. The body 19 is an electrical insulation ring seated in a circular recess 22 in top wall 14. An O-ring 23 located in a groove in top wall 14 maintains a sealing relationship between body 19 and top wall 14. A disc cathode or target 24 has an outwardly directed annular lip 24A located on shoulder 21.

The cathode 24 is made of at least two metals which are to be used for an alloy coating in the process of the present invention. For example, the cathode or target may have a base of titanium indicated at 25, with a recess containing a central insert of zirconium indicated at 26. The insert of zirconium 26 is removably mounted in the base 25. The insert 26 may have a light press fit into a provided recess in the base 25 and then when heated it expands to be securely held in place. The insert is provided with an appropriate center threaded vent hole 26A to prevent air from being trapped in the recess in the cathode base 25 and to enable easy change of the insert 26 when it is substantially consumed by the arc erosion process. A screw can be threaded into vent hole 26A to provide an element to use for pulling the insert out of the recess in cathode base 25. The removable insert 26 may also be made of other material for the deposition of other alloyed materials, such as titanium-hafnium nitride, by simply changing the insert 26, that is by replacing the zirconium insert with a hafnium insert. This way, many different alloys may be produced with the same cathode base 25. The two (or more) metals comprising the cathode or target 24 are used for forming an alloy coating on an object 32, such as a turbine blade, a tool bit or the like.

An electrical insulator support 33 attached to bottom wall 13 locates object 32 in vacuum chamber 12. Other types of supports can be used to hold the object in vacuum chamber. Other types of objects, parts, plates, and the like can be coated with an alloy coating formed from materials 25 and 26 forming cathode 24. The active surfaces 27A and 27B of cathode or target materials 25 and 26, respectively, are subject to vacuum in chamber 12 from an opening 28. A metal sleeve 29 is located in an annular recess 31 in wall 14 surrounding opening 28. Metal sleeve 29 shields the insulation body 19 to prevent an electrical short between the cathode and an anode 34, caused by the deposition of coating flux from the cathode on the inner cylindrical surface of body 19.

The anode 34 is a ring or annular anode which extends into opening 28 and is mounted on top wall 14 with a plurality of electrical insulation blocks 36, 37 and 38. The anode 34 is thus between the cathode or target 24 and the vacuum chamber 12. Anode 34 in plan view preferably has a circular sharp edge 35 facing cathode 24, and an outer cylindrical surface 39 spaced inwardly from annular metal sleeve 29. The cross sectional shape of the ring forming anode 34 is generally triangular as shown in FIG. 3. The lower portion of the inner surface of anode 34 tapers outwardly to minimize interference with the passage of alloy flux formed from cathode 24 through the center opening of anode 34 to vacuum chamber 12 during operation.

A cathode carrier 41, made of electrical conducting material, telescopes into body 19 and retains disc cathode 24 on shoulder 21. Carrier 41 has a first seal or O-ring 42 engageable with body 19 and a second seal or O-ring 43 engageable with the top of disc cathode 24. Carrier 41 has an internal chamber 47 for a cooling liquid 48, such as water. A liquid supply line 49 carries liquid from a supply source and a liquid return line 52 carries the liquid out of chamber 47 for continuous cooling.

An arc control magnet apparatus indicated generally at 53 is located in chamber 47 adjacent the cathode base surface, which is opposite from the active surfaces 27A and 27B. Magnet apparatus 53 is operable to generate a magnetic field on the active surface 27A and 27B of cathode 24 and defining a closed path which an arc will follow. The path is formed where the vertical field vectors go to zero as shown in FIG. 6, and preferably this is located at the surface of the cathode in a continuous, closed path defined by the magnetic field. Magnet apparatus 53 has an inverted cup-shaped member 54 having an open end facing cathode 24. Member 54 is a soft magnetic structure having a cylindrical flange 55 forming an outer, peripheral magnetic pole located in close relation to the base surface of cathode 24. This base surface is opposite from the active surface 27A and 27B.

A cylindrical disc magnet member or center magnetic pole 56 is attached to the center portion upper wall of cup member 54. The outer surface of magnet member 56 is spaced from the annular sidewall of the cup-shaped member 54 by an annular gap or space 57. The cup-shaped member 54 is attached to an electrical insulator mounting plate 58. A rotatable shaft 59 is mounted in a bearing assembly 64, projects into chamber 47 and is secured to mounting plate 58. Shaft 59 rotatably supports mounting plate 58 and magnet apparatus 53 in the chamber 47 spaced slightly from cathode 24. A variable speed electric motor 61 is operable to rotate the shaft 59 as indicated by arrow 62 about the shaft axis 63. Magnet apparatus 53 has a central magnetic axis 66 offset from shaft axis 63 whereby on rotation of shaft 59 by motor 61 the magnet apparatus 53 is moved in a continuous circular path. As shown a point of the wall 55 of cup shaped member 54 is displaced with respect to the axis 63 of the shaft 59 so as the shaft is rotated the path of the arc does not overlap the center of the cathode 24 which is shown at 63 in FIG. 4.

Figure 4:
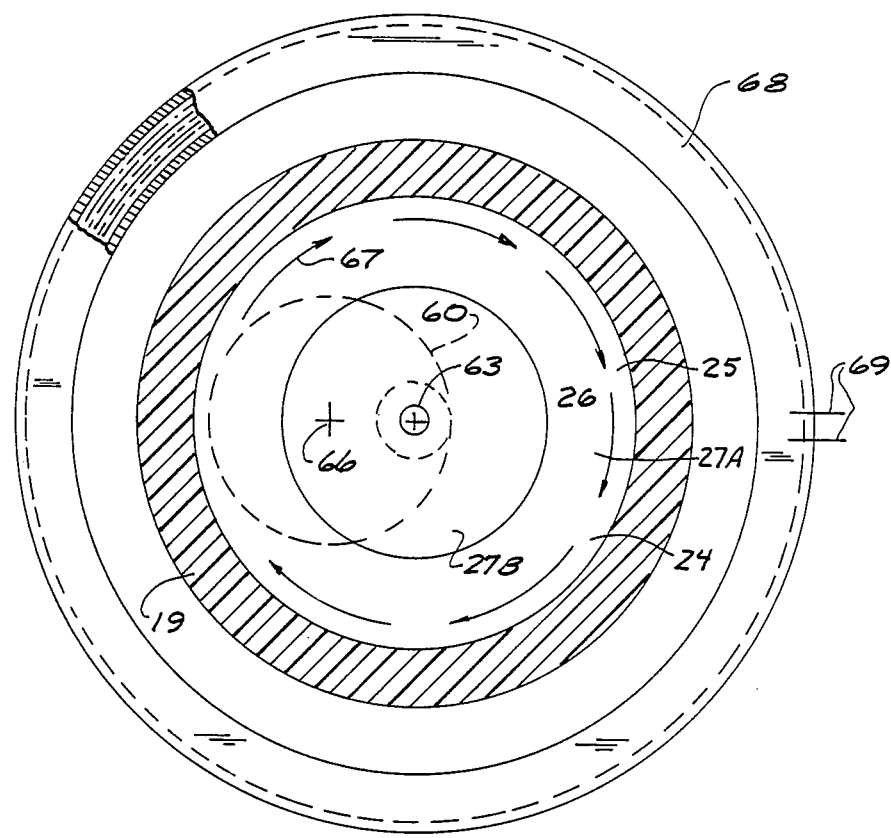
FIG. 4 is a sectional view taken along the line 4—4 of FIG. 3.

The outer edge of the circular path is illustrated at 67 in FIG. 4. This arrangement enables the sweeping of the closed arc track 60, as defined by the magnet apparatus, in an orbit. The arc track 60 represented in dotted lines in FIG. 4 is close to the outer wall or pole 54 of the magnetic apparatus, and the dotted line. The dotted line 60 also shows the configuration of pole 55. The arc thus sweeps an annular area between the center axis 63 of the cathode 27 and an outer circle 70 on the active surfaces 27A and 27B of cathode. The active surfaces 27A and 27B of the cathode 24 are the alloy flux producing surfaces for forming the coating. The arc track 60 spans the active surfaces of both metals used for alloying, to provide flux from both metals for the coating. The amount the arc track overlaps each surface 27A or 27B and the shape of the arc track, substantially, but not exclusively controls the amount of flux from each metal. The magnetic center or axis 66 of the magnet apparatus 53 can be displaced by different amounts with respect to axis 63, to provide more or less overlap of the arc track in the center of the cathode or target, if desired.

Other shapes of the magnet apparatus and appropriate choices of rotational axes can be used to define arc tracks and to cause these arc tracks to sweep the active surface of the cathode 24 in different relationships for different results.

Electric coil magnet structure can be used in lieu of the permanent magnet to establish the desired magnetic field to control the arc path shape. The magnetic field forms a closed path where the vertical magnetic field vectors go to zero, as approximately illustrated by flux paths indicated at 50 in FIG. 5, from pole 55 to magnet or pole 56.

The vertical and horizontal components of the magnetic field acting perpendicular and parallel to the cathode surface are shown in the upper portion of FIG. 6. The upper curve 80 shows the magnitude of the vertical component of the magnetic field across the cathode 24 in relation to the magnetic apparatus 53. The second curve 81 depicts the magnitude of the horizontal or parallel component of the magnetic field acting on the cathode surface. The magnitudes of the field strengths perpendicular (the vertical component) and parallel (the horizontal component) to the cathode surface are determined by the choice of the permanent magnetic material of magnet 56 and the spatial distribution is determined by the dimensions and location of the pole piece 54. The vertical component of the magnetic field changes sign at the location determined by the wall 55 of the cup shaped member or pole piece 54 as indicated at 80A and 80B. Along this line on the cathode surface which is the shape of the wall 55, the vertical component of the field is zero and the arc follows this track or trajectory 60 (see FIG. 4). Control over the arc path is thus obtained by shaping the wall 55 of the cup shaped member 54. The arc is driven along the closed track by the continuously turning horizontal component of the magnetic field generated by the arc control magnetic apparatus 53.

Figure 5:
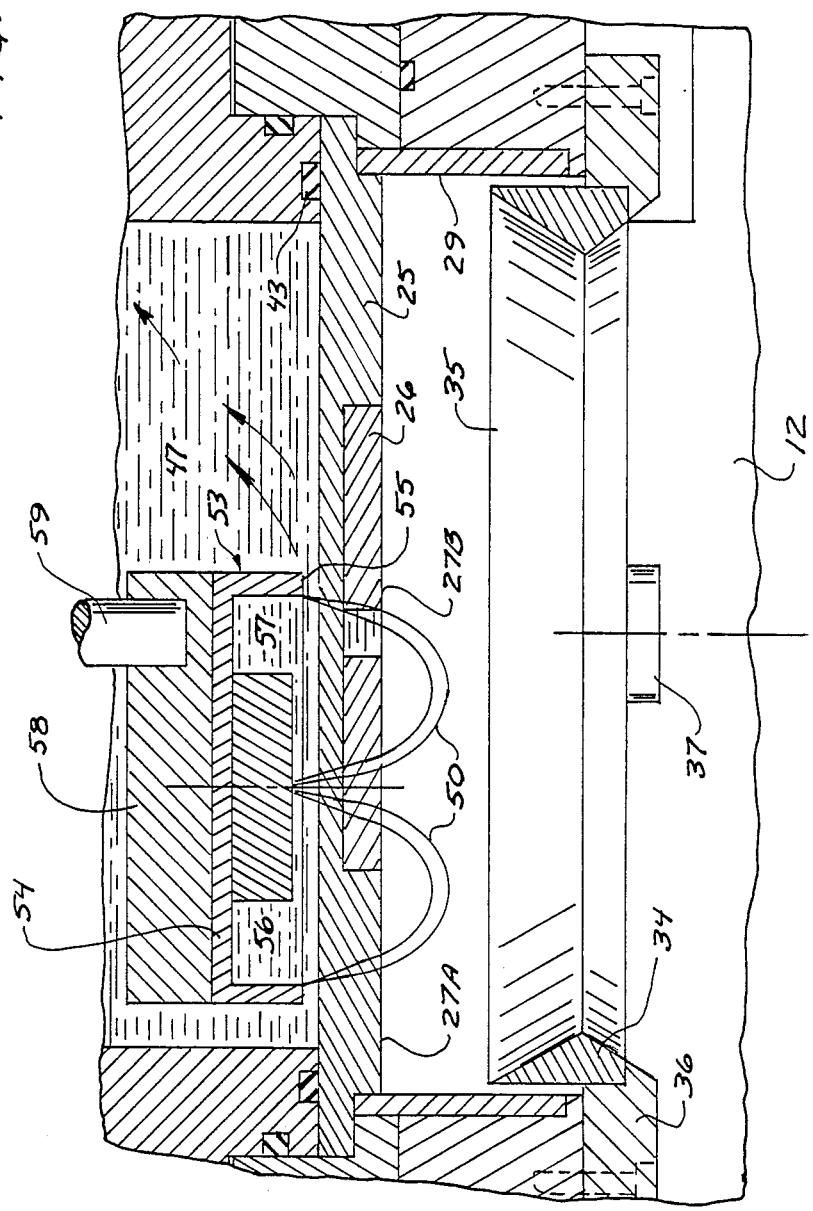
FIG. 5 is a sectional view substantially along the same line as FIG. 3 with parts removed for clarity and illustrating magnetic field lines and the flux from the cathode mixing as it forms the alloy when moving through the ring anode.

As can be seen in FIG. 4, the arc track or trajectory, that is the track of a series of arc spots formed by ion activity or continuous arc discharge when a molten track is formed, is controlled to be an annular track substantially as shown at 60, that is adjacent to the pole 55. The shape of the outer peripheral pole 55 in large part determines the shape of the arc track. Also, by spacing the surface of center magnet or pole 56 farther from the cathode than pole 55, as shown in FIGS. 3 and 5, the radial location of the arc track with respect to magnetic central axis 66, where the vertical field vectors are substantially zero, can be controlled to be within the cathode 24 and substantially on active surfaces 27A and 27B.

Along the closed path of the arc 60 defined by the wall 55, the horizontal component of the magnetic field is not zero as shown by vertical lines 81A and 81B in FIG. 6. The magnitude of the horizontal component of the magnetic field on the cathode surface along the arc path 60 and the material of the cathode 24 jointly determine the arc velocity. To produce an arc velocity sufficient to maintain a molten track, the magnitude of the horizontal component of the magnetic field on the cathode surfaces 27A and 27B is carefully selected. Formation of the molten track tends to produce a stable and continuous arc discharge. This is a preferred steered arc coating mode to minimize and eliminate macro-particle formation in the coated films.

The slope of the vertical component of the magnetic field, at points 80A and 80B where curve 80 changes sign on the cathode surface is varied by the choice of the permanent magnet material 56, the dimensions of the wall 55 of cup shaped member 54 and the location of the wall 55 with respect to the active surfaces 27A and 27B on the cathode 24. Shallow slopes (less vertical slopes in regions adjacent 80A and 80B) tend to produce lateral arc motion or arc "jiggle" as the arc travels around the preferred arc track or trajectory. A sharp (narrow) arc track and a continuous molten arc track on the cathode surfaces 27A and 27B are then difficult to produce and hard compound films deposited under these conditions show decreased macro-particle formation but not their complete elimination. Macro-particles in the film deposited are not desirable. A distinct minimum in the vertical component of the magnetic field of sufficiently large magnitude, as shown at 80C and 80D in FIG. 6, is found to produce tight control over arc motion and to prevent arc movement in the transverse direction. Stable arc tracks as close as possible to 0.020 inch in width are highly desired for macro-particle elimination when hard compound films are deposited with arc coating.

As shown in FIG. 3 an electrical coil or winding 68 is mounted on top wall 14 concentric with shaft axis 63. Coil 68 surrounds head 18 and is located generally in the plane of cathode 27. Coil 68 is a solenoidal coil operable to cancel out or greatly reduce the vertical magnetic field components of magnet apparatus 53, and generate a purely parallel magnetic field at preferred locations on the active surface of the cathode 24. The super-position of the coil field on the magnet field of magnet apparatus 53 results in tighter control over closed path where the vertical field vectors go to zero or to define the arc track 60. Lines 69 connect coil 68 to a suitable variable current control 69A. The control can be a manual current control device or a computer controller that can be programmed to regulate the current to coil 68. A current passing through coil 68 modifies the main magnetic field produced on the active surfaces 27A and 27B of cathode 24 by magnet apparatus 53 and controls the velocity of the arc in its path or track. The direction of the current through coil 68 is chosen to reinforce or reduce the magnetic field strength normal to the cathode active surface 27 of cathode 24. The vertical magnetic field component of the field from magnet apparatus 53 can be cancelled, greatly reduced or can be increased by the superposition of a magnetic field generated by solenoid 68. This results in a tighter control over the arc track.

Figure 7A:
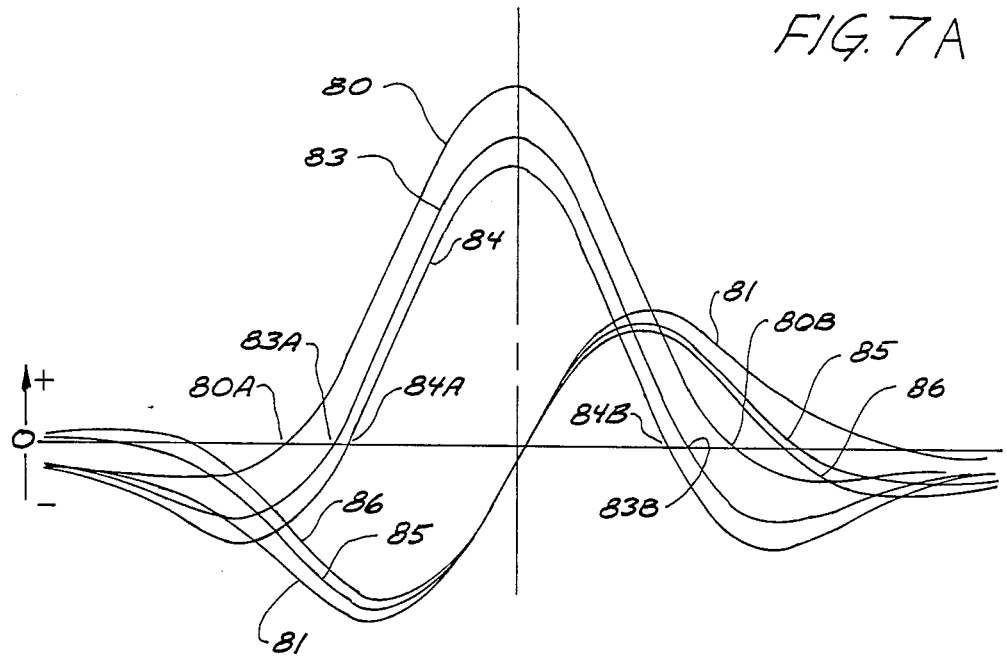
FIG. 7B is a sectional view substantially along the same line as FIG. 6B (inverted from FIG. 3) with parts removed for clarity and correlated with a graph of FIG. 7A which is positioned above the inverted cathode illustrating the vertical and horizontal components of the magnetic field on the cathode surface, with and without the superposition of an additional electrically generated magnetic field, its relation to the trajectory or track of the steered arc, and the peripheral poles of the arc steering permanent magnet means.
Figure 7B:
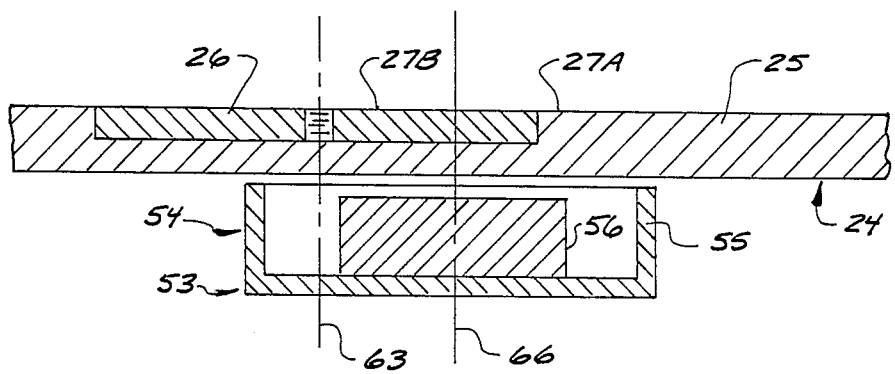

The vertical and horizontal components of the magnetic field acting on the cathode surface, with and without electric current in coil 68, are shown in the graph of FIG. 7. The superposition of an additional magnetic field (generated by passing electrical current through the coil 68) over the prevailing magnetic field due to the arc control magnet apparatus 53, allows changing the slope of the vertical component of the total magnetic field acting on the cathode surface along the preferred arc path. Steeper or shallower slopes of the vertical component where it goes to zero are obtained by changing the direction of current in coil 68. Magnetic fields generated by coil 68 opposing that due to arc control magnet apparatus 53, steepen the slope. By raising the coil current, a minimum in the vertical component of the field of sufficient magnitude for tight arc control is obtained outside the arc path. This greatly stabilizes the arc motion and allows arc steering in a tightly controlled narrow arc path. Higher slopes and deeper minima are obtained with larger currents in coil 68.

Energizing coil 68 does not significantly change the arc path dimensions which are primarily controlled by wall 55 of the pole 54. The field created by passing current through the solenoidal coil 68 also affects the horizontal component of the total magnetic field. However, the effect is not very large and hence the arc velocity is not significantly affected, when coil 68 is placed on or near the plane of the active surfaces 27A and 27B of cathode 24.

In the graph of FIG. 7, the uppermost curve 80 again shows the vertical field component due to the permanent magnet assembly 53 alone. The curve 83 shows the effect on the vertical field component of the magnetic field over the cathode surface by the superposition of a first electrically generated magnetic field acting in opposition to the magnetic field of the arc control magnet apparatus by passing a first current through coil 68. The curve 84 shows the effect of a second greater current through coil 68. The current used to generate the electromagnetic fields can be changed to obtain different vertical field component distributions. The curve 81 shows the horizontal field component with only magnet apparatus 53. Curve 85 is the horizontal component with the same first current as for curve 83 and curve 86 is the horizontal field for the same second current as for curve 84. The slope of lines 83 and 84 where they cross zero, as at points 83A, 83B and 84A, 84B can be increased (made more vertical) as shown.

By relocating the coil in relation to the cathode surface, substantial changes in the horizontal component and hence the arc velocity can be obtained. When target materials such as zirconium, which tend to yield high arc velocities are used, relocating coil 68 to control and reduce the arc velocity is a preferred option.

When current direction is reversed in coil 68 such that the two magnetic fields in magnetic apparatus 53 and coil 68 act in the same direction, the slope of the vertical field component on the cathode surface where the vertical field goes to zero is substantially reduced. This leads to poor arc steering, poor arc control and arc instability. The arc spirals out toward the edges of the cathode in the form of "comma" under these conditions. Sufficiently large currents in coil 68 in the reverse direction can provide arc paths that lie outside the active surface of the cathode.

As shown schematically in FIG. 1, a second coil 68A may be mounted on bottom wall 13 of the housing 11 in axial alignment with coil 68. Lines 69B connect coil 68A to a power supply and current control circuit or device, which may be the same as the control 69A for coil 68, and a power supply. Coils 68 and 68A may be concurrently used as a Helmholtz coil system to selectively modify the magnetic field produced on each of the active surfaces 27A and 27B of the cathode or target 24. This is an alternate means of controlling the magnetic field on the active surfaces 27A and 27B of cathode 24. This arrangement, when coils 68 and 68A are properly selected, permits controlling the field to increase velocity of the arc in portions of the arc track with respect to other portions, so the amount of flux generated from each metal forming the cathode or target is controlled.

By using a properly proportioned and located Helmholtz coil assembly 68 and 68A, a purely vertical magnetic field is superposed over that acting on the cathode surface portion 27A and 27B due to the arc control magnet apparatus 53. In this instance, the horizontal field is unaffected and the arc velocity on the cathode surface portions remains unaltered. Arc stability depends on the current direction as when the solenoidal coil 68 is used.

By making the separation distance between coils 68 and 68A larger than their effective diameter, a magnetic field is created to steepen the slope of the horizontal field. This serves to increase the arc velocity on the cathode surface. The arc travel on the cathode may be slowed down by current reversal.

In FIG. 6, the vertical component of the magnetic field due to the arc steering apparatus 53 is arbitrarily taken to be positive, with the highest positive field at the center of the magnetic apparatus 53 (along axis 66) assumes the surface of the permanent magnet 56 closest to active cathode surfaces 27A and 27B to be a north pole. By flipping the magnet 56, surface nearest the cathode is made the south pole. Such magnet flipping does not alter the location of the arc track and does not affect the arc steering processes. When this is done and coil 68 is energized for better arc control, the current direction in coil 68 is also reversed for arc steering and arc stability.

As shown in FIG. 1, a suitable power supply 73 can be connected to anode 34 through a line 71. Power supply 73 includes a variable current control 73A. Supply 73 is also connected to an electrical conductor 74 leading to cathode carrier 41 and thereby connecting cathode 24 to power in a known arrangement. Varying the arc current changes the arc velocity in the arc track as well. This adjustment controls the composition by changing the arc current while the cathode composition and construction, the magnet field controlling the arc shape, and the target dimensions remain constant.

Housing 11 (FIG. 1) has a valve 78 to allow the introduction of a suitable gas, such as nitrogen, as well as other desired gases and gas mixtures, into vacuum chamber 12. A second valve 77 can be a leakage valve used to adjust or release the vacuum in chamber 12.

In use, the central magnet member 56 carried by the soft magnetic member 54 produces a circular symmetric closed fringing magnetic field between the outer pole 55 and the center pole 56 as shown. The geometry of anode 34 and cathode 24 are such that the magnetic field produced by the magnetic apparatus 53 is generally normal to the electric field generated between cathode 24 and annular anode 34 when an appropriate electrical potential difference is applied to the anode and cathode. The magnetic apparatus 53 acts as an electron trap for electrons emitted from the active cathode surfaces 27A and 27B when a high voltage is applied to the cathode 24. A negative potential is applied to cathode 24. In the absence of a magnetic field in the vicinity of the cathode 24, a weak discharge is induced within the vacuum chamber. Inert gases such as Argon and Krypton, are admitted into the chamber 12 via valve 78 to induce magnetron-like self-sustaining glow discharge. The discharge current is a function of gas species, chamber pressure, and applied voltage. When an electron trap is produced with a large electric and magnetic field, and an arc cathode with a rough surface is used, a transition occurs from the magnetron-like discharge to arc discharge.

When an arc supply is connected to the cathode and anode, and a high voltage is applied to the cathode with suitable means to prevent the high voltage from passing into the arc power supply, the magnetron-like discharge undergoes a transition to arc discharge and ignites the arc. The high voltage arc ignition supply is then turned off and the arc is sustained with the high current low voltage arc power supply.

The arc produced between anode 34 and cathode 24 is steered by the magnetic field of magnet apparatus 53 (and coil 68 or coils 68 and 68A when desired) and sustains itself indefinitely. The arc track or trajectory is determined by the shape of pole or member 56 and the annular ring configuration of member 54. In the embodiment of FIGS. 3 and 4, as illustrated in FIG. 4, the arc track 60 is a circular path on active surface 27 of cathode 24. The arc track may take rectangular, elliptical or other desired shapes.

Intense arc erosion (and thus formation of alloying flux) occurring along the arc track 60 would result in the formation of grooves on the active surfaces 27A and 27B of cathode 24 if the magnetic apparatus 53 stayed in one position. The erosion and flux forming action is distributed more evenly over the surfaces by rotating the magnet apparatus 53 around axis 63. The rotation of the magnet apparatus 53 causes the arc track 60 defined by the magnet apparatus 53 to trace a cycloidal path on the active surface 27 of cathode 24. The dimensions of pole 55 and cathode 24 may be chosen so as to cause the arc path and hence arc erosion of the cathode to be confined to an annular, ring-shaped region between the axis 63 and circles 70 in FIG. 4 of the active surfaces 27A and 27B of cathode 24. The inner radius of this ring region may be zero, but as shown, a non-zero radius is used. It can be varied by the appropriate choice of magnetic axis 66 and the shape and dimensions of pole 56. The velocity of the arc can be changed by adjusting arc current using current control 73A. Also, using adjustable current control 69A to selectively control current to coils 68 and 68A, the velocity can be controlled in certain portions of the arc track.

Rectangular arc tracks and connected part circular arc tracks may be realized with appropriate variations in the geometry of pole 55. Other closed arc tracks, such as triangular and elliptical, can be used. The condition to be met to fulfill generation of a closed arc track, such as track 60, is the presence of continuously turning magnetic field vectors where the vertical component of the field vectors go to zero on the active surfaces 27A and 27B of cathode 24.

With strict arc track control, arc induced cathodic erosion is confined to the arc track. Using a time varying magnetic field of appropriate magnitude generated with coil 68, or coils 68 and 68A, and controlled speed of motor 61, the arc track can also be made to sweep over major portions of the active surfaces 27A and 27B of the cathode 24 to insure erosion of the alloying materials in composition target or cathode 24 in the proper proportion of the two different metals 25 and 26. This insures high cathode material utilization efficiency.

Ion activity and differential vapor pressures generated cause the arc spot to move in its defined arc track as controlled by the magnetic field. The precise control achieved permits proper proportioning of the alloying metals forming the flux for deposition. Admitting active gases such as nitrogen through valves 77 and 78 permits forming alloy nitride coating.

The metal target or cathode serves as a source for the coating flux, and by reacting the flux derived from two different metals, selected from a suitable group, with a reactive gas such as nitrogen, titanium zirconium nitride coatings are easily produced. Alloy nitrides are expected to yield properties superior to those obtainable with mono-nitrides. This method and apparatus shows that alloy nitrides using arc coating techniques can be deposited at low cost, and relatively simply, as long as the path of the arc can be precisely controlled to control the proportion of the alloying metals in the flux for the deposited layer, and of course the control of the arc into a desired path can determine the rate with which deposition occurs so that the proper alloying effect is obtained.

Composite targets of titanium and zirconium, as shown in FIGS. 3 and 5 were fabricated with a zirconium insert in a titanium base to produce mixed or alloyed nitrides. Nitrides of both these metals have a cubic NaCl-type lattice and are known to possess continuous solid solubility. Alloyed nitrides of the form $(Ti_xZr_y)N$ are expected to exhibit solution hardening characteristics and hence superior hardness and tribological properties. Synthesis of such alloyed nitride is therefore of considerable technical and commercial interest.

The work function of titanium (3.95 electron volts) is lower than that of zirconium (4.12 to 4.21 eV). The melting temperature of titanium is also lower than zirconium. It is therefore virtually impossible to obtain controlled alloy nitride film production with a composite target when random arc coating processes are used. The arc tends to remain substantially on the surface of the material producing copious vapor flux at a lower temperature. In the present example, this is titanium.

In contrast, when the steered arc coating process is used, by controlling the arc trajectory on the composite cathode surface using the magnetic means shown herein, the arc is forced to reside for controlled durations of time in the zirconium and in the titanium portions of the target. Residence time control is obtained by measuring the arc velocity in titanium and zirconium under a given set of arc coating conditions, i.e., the arc current and the transverse magnetic field strength on the cathode surface. Using this information the size of the zirconium insert is selected in relation to the size of titanium part and the peripheral length of the arc track used to steer the arc.

By reproducing the arc current, the magnetic properties of the arc steering means, the proportions of the target comprising of titanium and zirconium, and the size of the arc track, precise control of the composition is attained in the film deposited. This particular design possesses an additional advantage. For a fixed set of composite target or cathode dimensions, arc track dimensions and arc steering means, change in arc current and thus the arc velocity or speed enables control over the composition. Continuous variation in composition of the $(Ti_xZr_y)N$ film produced is hence obtained easily by controlling the power supply.

$(Ti_xZr_y)N$ films were deposited experimentally using the composite cathode shown in FIG. 3, and the steered arc coating process. Steered arc coated samples produced with an arc current of 50 amperes exhibited, in X-ray diffraction analysis, first and second diffraction peaks at 35.5 and 41.5 degrees indicating the formation of $(Ti_xZr_y)N$. Values of x and y corresponding to this deposited alloy compound will vary and may be determined by known X-ray fluorescence analysis and other techniques. Semi-quantitative analysis using an energy dispersive spectrometer yielded atomic abundances of 25.5% zirconium and 3.3% titanium for the film deposited on a steel substrate. The alloy compound is atomically a little richer in titanium than zirconium.

Using the same composite target, arc steering system and arc track, films produced at an arc current of 75 amperes yielded X-ray diffraction peaks at 35, 41, and 59.9 degrees. Semi-quantitative analysis yielded relative atomic abundances of 29.67% zirconium and 18.7%, titanium in films deposited on a steel substrate. This film is richer in zirconium than titanium, although a cathode having the same construction was used.

Peaks corresponding to pure ZrN and TiN could not be detected in both the samples produced (X-ray diffraction analysis). An alloyed nitride corresponding to $(Ti_xZr_y)N$ was produced and verified the formation of the single phase nitride by X-ray diffraction analysis.

The same composition for a cathode was used in an effort to synthesize and deposit alloyed nitrides of the form $(Ti_xZr_y)N$ with the random arc coating process as taught in the Sablev et al. and Snaper patents. X-ray diffraction analysis produced peaks at 36.5 and 42.5 degrees, slightly differing from those for TiN (36.84 and 42.65) in samples produced with arc currents of 50 amperes and 75 amperes. Energy dispersive X-ray analysis for semi-quantitative chemical composition calculation yielded substantial titanium counts but produced barely discernable zirconium counts.

Both X-ray diffraction analysis and energy dispersive X-ray chemical analysis confirm that using a composite target, single phase TiN-ZrN alloys are not produced when the random arc coating process is used.

The present invention permits synthesizing alloyed hard compounds (single phase materials) of mutually soluble hard compounds using a single composite cathode or target, the composition can be controlled through the choice of dimensions of the titanium and zirconium parts of the composite target or by changing the arc current used in the process (the cathode size, the magnetic steering means and arc track dimensions remain constant).

The arc velocity in each part of the target also can be controlled by changing the field strength of the magnetic arc steering means.

Several different alloyed hard compounds, such as titanium hafnium nitride (Ti-Hf-N), titanium-vanadium nitride (Ti-V-N), titanium niobium nitride (Ti-Nb-N), titanium tantalum nitride (Ti-Ta-N) partially soluble and therefore capable of producing "dispersion hardened" alloy compounds may be used having the same cathode base or body 25 and replaceable insert 26. Alloys of these forms may also permit precipitation-hardened alloy compounds with superior hardness and wear resistance.

The alloying is not limited to Ti(M)N, where (M) can stand for chromium (Cr), molybdenum (Mo), tungsten (W), uranium (U), manganese (Mn), iron (Fe), and platinum (Pt) group of metals but also compounds of the form Zr(M)N, Hf(M)N, V(M)N, Ta(M)N, Cr(M)N, Mo(M)N, W(M)N can be formed. We also claim alloyed compounds of the carbide family using carbon-rich gases for reactive synthesis instead of nitrogen. Mixed oxides as well as carbo-nitrides, oxy-carbides, oxy-nitrides, etc., are producible with corresponding mixed gases in the steered arc deposition process.

It has been shown that improved coatings are possible, and that arc coating with composite targets offers a low cost way of producing improved coatings for friction and wear applications. The steered arc, and the control of the arc path is essential to a sure coating composition and reproducibility, because the various factors that are controllable, such as power levels to the anode and cathode, the size of the cathode, and the relative position and volume of the respective metals being used for the alloy, and other physical factors can be easily controlled, but unless the arc path is predetermined, repeatable, and controlled in a desired manner, the amount of the respective metals in the flux being generated by the arc can vary and thus make it impossible to properly form the coating.

Although the present invention has been described with reference to preferred embodiments, workers skilled in the art will recognize that changes may be made in form and detail without departing from the spirit and scope of the invention.

What is claimed is:

1. A method of providing an alloy film on a member comprising the steps of providing an anode and a cathode for forming a plasma discharge arc;

forming the cathode to have an active target surface of at least two dissimilar materials having the capability of supporting an arc in different active surface portions, the active surface portions being adjacent the anode;

forming an arc between the anode and cathode to generate a flux containing a desired proportion of each of the dissimilar materials for forming a deposited coating on the member; and providing a magnetic field adjacent the cathode of sufficient strength and field orientation to define a closed arc track in which the arc is confined to travel regardless of the materials forming the active surface portions by presence of the magnetic field on both of the different active surface portions of the cathode, so that as the arc moves in the closed arc track the arc thereby travels over regions of both of said different surface portions, the arc track length being defined in relation to the arc speed of travel so that cathode materials remain molten in the arc track as the arc moves in said arc track during operation.

2. The method of claim 1 wherein said cathode comprises two metals, having a generally flat active surface, and a first surface portion formed of one metal is concentric with the central axis of said cathode, and a second surface portion of a second metal surrounds the first surface portion.

3. The method of claim 2 wherein said arc track is rotated about a central axis, and said arc track remains spanning both of said surface portions during each rotation thereof.

4. The method of claim 1, including the step of providing second separate magnet means to alter the first mentioned magnetic field for providing arc control by increasing the slope of the vertical component of the magnetic field where the vertical component goes to zero.

5. The method of claim 1 wherein the anode is a ring type anode, and a vacuum chamber open to said ring type anode and the cathode is provided, said flux generated passing through said anode into said vacuum chamber, supporting the member within the vacuum chamber, and including the step of introducing a desired gas into the vacuum chamber for combining with the flux for depositing a film on a part supported therein.

6. A method of coating a part comprising the steps of providing a metal target having two different metals forming a surface thereof, forming an arc relative to said target to generate a flux, and magnetically steering the arc using a magnetic field having a horizontal component and providing an arc current so the arc formed sequentially moves in a closed arc track controlled in length so the cathode materials remain molten in the arc track during the coating process, and positioning the path defined by the magnetic steering so the arc track is partially in each metal of the cathode to provide a flux having a desired proportion of each of said metals as constituents thereof, and intermixing the flux with a gas which reacts with the flux in presence of a part to be coated to provide an alloy metal coating on such part.

7. The method of claim 6 wherein the intermixing with a gas comprises the step of intermixing nitrogen to form an alloy nitride coating.

8. The method of claim 6 including the step of changing the current flowing in the ac formed to control arc velocity.

9. The method of claim 6 including the step of providing a cathode base having a recess for receiving an insert therein and providing a replaceable insert for the recess.

10. The method of claim 9 including the step of providing a base of titanium and providing an insert of a dissimilar metal.

* * * * *

UNITED STATES PATENT AND TRADEMARK OFFICE
CERTIFICATE OF CORRECTION

PATENT NO. : 4,839,011  Page 1 of 2

DATED : June 13, 1989

INVENTOR(S) : Subbiah Ramalingam et al.

It is certified that error appears in the above-identified patent and that said Letters Patent is hereby corrected as shown below:

In the References Cited Section, under U.S. PATENT DOCUMENTS, add the following patents:

| | | | |
|---|---|---|---|
| 2,420,722 | 5/1947 | Peterson et al | 91/12.2 |
| 3,642,533 | 2/1972 | Ahn et al | 117/237 |
| 3,783,231 | 1/1974 | Sablev et al | 219/123 |
| 3,793,179 | 2/1974 | Sablev et al | 204/298 |
| 3,836,451 | 9/1974 | Snaper | 204/298 |
| 3,953,652 | 4/1976 | Addiss, Jr. et al | 428/412 |
| 4,448,659 | 5/1984 | Morrison, Jr. | 204/192R |
| 4,448,799 | 5/1984 | Bergman et al | 427/37 |
| 4,498,969 | 2/1985 | Ramachandran | 204/298 |
| 4,724,058 | 2/1988 | Morrison, Jr. | 204/192.38 |

In the References Cited Section, under FOREIGN PATENT DOCUMENTS, add the following patent documents

| | | | |
|---|---|---|---|
| 1014519 | 7/1977 | Canada | 204/167 |
| 1081656 | 7/1980 | Canada | 204/108 |
| 2163458 | 8/1984 | Great Britain | |
| 307666 | 1/1979 | U.S.S.R. | 427/37 |
| WO 85/03954 | 9/1985 | Int'l Pub. | |

UNITED STATES PATENT AND TRADEMARK OFFICE
CERTIFICATE OF CORRECTION

PATENT NO. : 4,839,011

DATED : June 13, 1989

INVENTOR(S) : Subbiah Ramalingam et al.

It is certified that error appears in the above-identified patent and that said Letters Patent is hereby corrected as shown below:

In the References Cited Section, under OTHER PUBLICATIONS, add the following:

Boxman, R.L., et al, "Behavior of a High Current Vacuum Arc Between Hollow Cylindrical Electrodes in a Radial Magnetic Field," IEEE, pp. 308-313, December 1980.

Lucas, M.S.P., et al, "A New Deposition Technique for Refracting Metal Films," pp. 988-991.

Naoe, M. and Yamanaka, S., "Vacuum-Arc Evaporations of Ferrites and Compositions of Their Deposits", Japanese Journal of Applied Physics, Vol. 10, No. 6, June, 1971 (pg. 752, col. 2)

Column 15, line 2, delete "ac", and insert --arc--.

Signed and Sealed this

Tenth Day of April, 1990

Attest:

HARRY F. MANBECK, JR.

*Attesting Officer*   *Commissioner of Patents and Trademarks*